United States Patent
Yoon et al.

(10) Patent No.: US 7,994,713 B2
(45) Date of Patent: Aug. 9, 2011

(54) ORGANIC LIGHT EMITTING DIODE AND METHOD OF FABRICATING THE SAME

(75) Inventors: Ji-Hwan Yoon, Suwon-si (KR);
Byung-Hoon Chun, Suwon-si (KR);
Seong-Jong Kang, Suwon-si (KR);
Sung-Jun Bae, Suwon-si (KR);
Eun-Jung Lee, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 149 days.

(21) Appl. No.: 12/350,868

(22) Filed: Jan. 8, 2009

(65) Prior Publication Data
US 2009/0179559 A1 Jul. 16, 2009

(30) Foreign Application Priority Data
Jan. 15, 2008 (KR) .................. 10-2008-0004546

(51) Int. Cl.
*H01L 51/10* (2006.01)
(52) U.S. Cl. ...................... 313/506; 313/504
(58) Field of Classification Search .......... 313/504, 313/506; 428/690, 917
See application file for complete search history.

(56) References Cited

U.S. PATENT DOCUMENTS

| | | | |
|---|---|---|---|
| 2005/0179370 A1* | 8/2005 | Nakayama et al. | 313/504 |
| 2008/0231174 A1* | 9/2008 | Parthasarathy et al. | 313/504 |
| 2009/0218934 A1* | 9/2009 | Song et al. | 313/504 |
| 2010/0243992 A1 | 9/2010 | Tsuji et al. | |

FOREIGN PATENT DOCUMENTS

| | | |
|---|---|---|
| JP | 2001-247498 A | 9/2001 |
| JP | 2002-043063 | 2/2002 |

(Continued)

OTHER PUBLICATIONS

Office action dated Sep. 12, 2008 for corresponding Korean Patent Application No. 10-2008-0004546 indicating relevance of KR 10-2005-0092102 and KR 10-2005-0054945.

(Continued)

*Primary Examiner* — Karabi Guharay
(74) *Attorney, Agent, or Firm* — Christie, Parker & Hale, LLP

(57) ABSTRACT

An organic light emitting diode (OLED) and a method of fabricating the same are provided. In the OLED, a second electron transport layer having an absolute value of a lowest unoccupied molecular orbital (LUMO) energy level smaller than that of a first electron transport layer is formed between a second electrode and the first electron transport layer, so that the second electron transport layer can suppress injection and transport of electrons under a low voltage condition to maintain a low current density. Accordingly, it is possible to prevent (or block) an element from emitting light when representing the color black. The OLED includes an emission layer on the first electrode, the first electron transport layer on the emission layer, the second electron transport layer on the first electron transport layer, and the second electrode on the second electron transport layer.

18 Claims, 3 Drawing Sheets

FOREIGN PATENT DOCUMENTS

| | | |
|---|---|---|
| JP | 2006-049438 A | 2/2006 |
| JP | 2006-066872 | 3/2006 |
| KR | 10-2005-0054945 | 6/2005 |
| KR | 10-2005-0092102 | 9/2005 |
| KR | 10-2006-0134469 | 12/2006 |
| KR | 10-2007-0093881 | 9/2007 |
| WO | WO 2004/082338 A1 | 9/2004 |
| WO | WO 2007/069741 A1 | 6/2007 |

OTHER PUBLICATIONS

KIPO Notice of Allowability dated Mar. 6, 2009, for priority Korean application 10-2008-0004546 noting reference listed in this IDS and KR 10-2005-0054945 and KR 10-2005-0092102 listed in the Jan. 8, 2009 IDS.

Notice of Allowance dated Dec. 21, 2010 in corresponding Japanese Patent Application No. 2008-306326, 3 pages.

* cited by examiner

US 7,994,713 B2

ORGANIC LIGHT EMITTING DIODE AND METHOD OF FABRICATING THE SAME

CROSS-REFERENCE TO RELATED APPLICATION

This application claims priority to and the benefit of Korean Patent Application No. 10-2008-0004546, filed Jan. 15, 2008, the entire content of which is incorporated herein by reference.

BACKGROUND OF THE INVENTION

1. Field of the Invention

The present invention relates to an organic light emitting diode and a method of fabricating the same.

2. Description of the Related Art

An organic light emitting diode, utilized as a self-emissive display, is thin and light, and has simple components and manufacturing processes. It can produce a high-quality image with a wide viewing angle, it can display ideal moving images and high color purity, and it has low power consumption and low driving voltage characteristics suitable for mobile displays.

A conventional organic light emitting diode includes a pixel electrode, an emission layer (EML) formed on the pixel electrode, and an opposite electrode formed on the EML.

In order to effectively perform injection or transport of electrons from the opposite electrode to the EML, one or a plurality of layers such as an electron transport layer (ETL) or electron injection layer (EIL) may be further interposed between the EML and the opposite electrode.

In the structure of the conventional organic light emitting diode, layers interposed between the opposite electrode and the EML are generally disposed such that the absolute value of the lowest unoccupied molecular orbital (LUMO) energy level decreases in steps from the opposite electrode to the EML. However, in the aforementioned structure, even under a low voltage (e.g., about 4V or less) for displaying black, a current density of about 0.1 mA is maintained, resulting in a certain degree of luminous efficiency. Therefore, an element may dimly emit light when the black color is represented, which degrades the quality of the organic light emitting diode by lowering contrast and misrepresenting black in a dark place.

SUMMARY OF THE INVENTION

Aspects of embodiments of the present invention are directed toward an organic light emitting diode and a method of fabricating the same that can prevent (or block) the organic light emitting diode from emitting light when displaying black by suppressing injection and transport of electrons at a low voltage to maintain a low current density. To put it another way, aspects of embodiments of the present invention are directed toward an organic light emitting diode and a method of fabricating the same that can prevent (or block) an element from emitting light when a black color is to be represented by suppressing injection and transport of electrons at a low voltage to maintain a low current density.

According to an embodiment of the present invention, an organic light emitting diode includes: a first electrode; an emission layer on the first electrode; a first electron transport layer on the emission layer; a second electron transport layer on the first electron transport layer, and having an absolute value of a lowest unoccupied molecular orbital (LUMO) energy level smaller than that of the first electron transport layer; and a second electrode on the second electron transport layer.

According to another embodiment of the present invention, a method of fabricating an organic light emitting diode includes: forming a first electrode; forming an emission layer on the first electrode; forming a first electron transport layer on the emission layer; forming a second electron transport layer on the first electron transport layer, the second electron transport layer having an absolute value of a lowest unoccupied molecular orbital (LUMO) energy level smaller than that of the first electron transport layer; and forming a second electrode on the second electron transport layer.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1A:
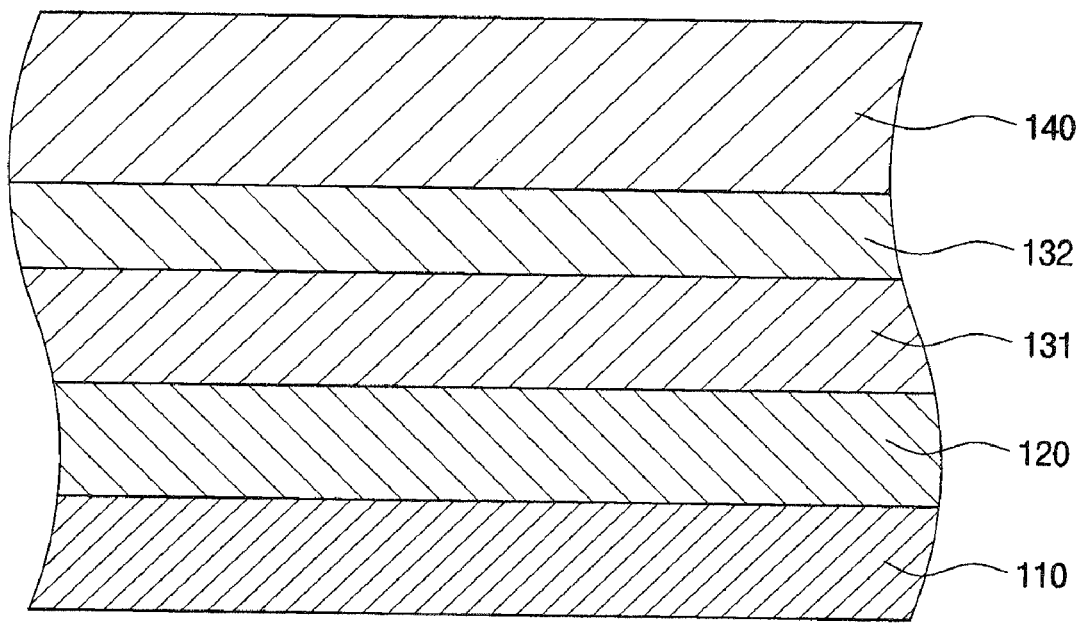
FIGS. 1A and 1B are cross-sectional schematic views of organic light emitting diodes in accordance with embodiments of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Also, in the context of the present application, when an element is referred to as being "on" another element, it can be directly on the another element or be indirectly on the another element with one or more intervening elements interposed therebetween. Like reference numerals designate like elements throughout the specification.

Figure 1B:
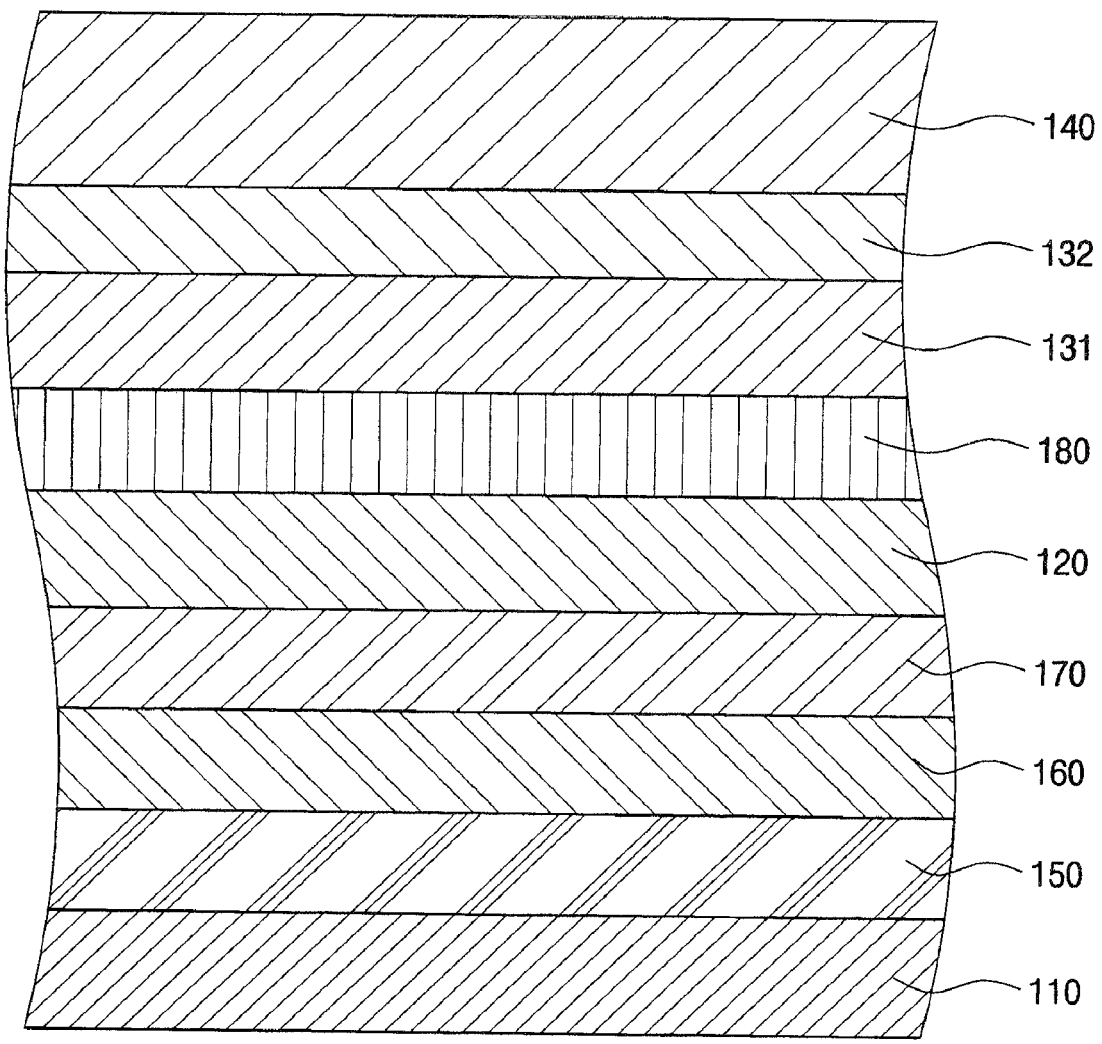

FIGS. 1A and 1B are cross-sectional schematic views of organic light emitting diodes in accordance with embodiments of the present invention.

Referring to FIG. 1A, a first electrode 110 is formed on a substrate made of a material such as glass, plastic or stainless steal.

The first electrode 110 may be an anode, and may be transparent or reflective. When the first electrode 110 is transparent, it may be formed by an indium tin oxide (ITO) layer, an indium zinc oxide (IZO) layer, a tin oxide (TO) layer, and/or a zinc oxide (ZnO) layer. Alternatively, when the first electrode 110 is reflective, it may have a structure in which a transparent layer made of ITO, IZO, TO or ZnO is stacked on a reflective layer formed of silver (Ag), aluminum (Al), chrome (Cr), molybdenum (Mo), tungsten (W), titanium (Ti), gold (Au), palladium (Pd), or alloys thereof. The first electrode 110 may formed by a method such as sputtering, vapor phase deposition, ion beam deposition, electron beam deposition, or laser ablation.

An emission layer 120 is formed on the first electrode 110.

A material for forming the emission layer 120 in the present invention is not particularly limited. For example, a blue light emitting material may include oxadiazole dimmer dyes, (e.g., Bis-DAPOXP), spiro compounds (e.g., Spiro-DPVBi, Spiro-6P), triarylamine compounds, bis(styryl)

amine (DPVBi), DSA, 4,4'-Bis(9-ethyl-3-carbazovinylene)-1,1'-biphenyl (BCzVBi), perylene, 2,5,8,11-tetra-tert-butylperylene (TPBe), 9H-carbazole-3,3'-(1,4-phenylene-di-2,1-ethene-diyl)bis[9-ethyl-(9C)] (BCzVB), 4,4'-bis[4-(di-p-tolylamino)styryl]biphenyl (DPAVBi), 4-(di-p-tolylamino)-4'-[4(di-p-tolylamino)-styryl]stilbene (DPAVB), 4,4'-Bis[4-(diphenylamino)styryl]biphenyl (BDAVBi), bis(3,5-difluoro-2-(2-pyridyl)phenyl-(2-carboxypyridyl))iridium (III) (FirPic), and/or the like. A green light emitting material may include 3-(2'-benzotiazol)-7-(diethylamino)qumarine (Coumarin 6), 2,3,6,7-tetrahydro-1,1,7,7,-tetramethyl-1H,5H,11H-10-(2-benzothiazolyl)quinolizino-[9,9a,1gh] coumarin (C545T), N,N'-dimethyl-quinacridone (DMQA), tris(2-phenylpyridine)iridium (III) (Ir(ppy)3), and/or the like. And, a red light emitting material may include tetraphenyl-naphthacene (Rubrene), tris(1-phenylisoquinoline)iridium (III) (Ir(piq)3), bis(2-benzo[b]thiophen-2-yl-pyridine) (acetylacetonate)iridium (III) (Ir(btp)2(acac)), tris(dibenzoylmethane)phenanthroline europium(III) (Eu(dbm)3 (phen)), tris(4,4'-di-tert-butyl-2,2'-bipyridyl)ruthenium (III) complex (Ru(dtb-bpy)3*2(PF6)), DCM1, DCM2, (thenoyltrifluoroacetone)3 Eu(TTA)3), butyl-6-(1,1,7,7-tetramethyljulolidyl-9-enyl)-4H-pyran (DCJTB), and/or the like.

In one embodiment, the emission layer 120 includes a polymer light emitting material. The polymer light emitting material may include a phenylene-based polymer material, a phenylene-vinylene-based polymer material, a thiophene-based polymer material, a fluorene-based polymer material, a spiro-fluorene-based polymer material, and the like.

A first electron transport layer 131 is formed on the emission layer 120, and a second electron transport layer 132 is then formed on the first electron transport layer 131. The absolute value of the lowest unoccupied molecular orbital (LUMO) energy level of the second electron transport layer 132 is smaller than that of the first electron transport layer 131. The difference between the absolute values of the LUMO energy levels of the first and second electron transport layers 131 and 132 may, in one embodiment, be at least 0.2 eV. When the absolute value of the LUMO energy level of the second electron transport layer 132 is at least 0.2 eV less than that of the first electron transport layer 131, the second electron transport layer may effectively function to suppress the injection and transport of electrons injected from a second electrode to the emission layer under a low voltage condition for displaying black, e.g., a low voltage of about 4V or less, so that current density can be kept low. However, at other higher voltages, the second electron transport layer should not suppress the injection and transport of electrons, so that the same (or substantially the same) current density as in the conventional organic light emitting diode can be maintained. In terms of overall luminous efficiency, there should be no difference from the conventional organic light emitting diode.

In one particular embodiment of the present invention, the absolute value of the LUMO energy level of the second electron transport layer 132 is from 0.2 to 1 eV less than that of the first electron transport layer 131. When the absolute value of the LUMO energy level of the second electron transport layer 132 is over 1 eV less than that of the first electron transport layer 131, the second electron transport layer 132 may suppress the injection and transport of electrons to the emission layer 120 even at a high voltage depending on an element. Therefore, the absolute value of the LUMO energy level of the second electron transport layer 132 should be from 0.2 to 1 eV less than that of the first electron transport layer 131, so that the second electron transport layer 132 may effectively function to suppress the transport of electrons and prevent (or block) the light emission under a low voltage for displaying black, and to allow the transport of electrons to the emission layer under other higher voltages.

The first electron transport layer 131 may be formed of a material having an electron mobility of $1 \times 10^{-6}$ cm$^2$/V·s or more so as to activate the injection and transport of electrons to the emission layer 120. However, the second electron transport layer 132 may be formed of a material having a lower electron mobility than the first electron transport layer 131, i.e., less than $1 \times 10^6$ cm$^2$/V·s, so as to suppress the injection and transport of electrons under a low voltage for displaying black. In one embodiment, the second electron transport layer 132 is formed of a material having an electron mobility of $1 \times 10^{-8}$ cm$^2$/V·s or more so as to effectively allow the transport of electrons under a range of voltages not for displaying black.

The second electron transport layer 132 may be formed to a thickness of 1 to 20 nm. When the thickness of the second electron transport layer 132 is below 1 nm, the second electron transport layer 132 may not effectively suppress the transport of electrons under a low voltage. And, when the thickness of the second electron transport layer 132 exceeds 20 nm, the second electron transport layer 132 may suppress the transport of electrons under a range of voltages not for displaying black, and thus, luminous efficiency may be lowered. Therefore, when the thickness of the second electron transport layer 132 should be from 1 to 20 nm, such that the second electron transport layer 132 may effectively function to suppress the transport of electrons and prevent (or block) the light emission of the element under the voltage for displaying black, and to allow the transport of electrons to the emission layer under a range of voltages not for displaying black.

A material for forming each of the first and second electron transport layers 131 and 132 is not particularly limited as long as the material satisfies the suitable LUMO energy level and electron mobility requirements described above. For example, each of the first and second electron transport layers 131 and 132 may include at least one material selected from the group consisting of an oxazole-based compound, an isoxazole-based compound, a triazole-based compound, an isothiazole-based compound, an oxadiazole-based compound, a thiadiazole-based compound, a perylene-based compound, an aluminum complex (e.g., Alq$_3$ (tris(8-quinolinolato)-aluminum)), Balq, SAlq, Almq$_3$, a gallium complex (e.g., Gaq'$_2$OPiv, Gaq'$_2$OAc, 2(Gaq'$_2$)), BPQ (bis(phenylquinoxaline)), TPQ (starburst tris(phenylquinoxaline)), 1,3,5-triazine, BCP (2,9-dimethyl-4,7-diphenyl-1,10-phenanthroline), BeBq$_2$ (bis(10-hydroxybenzo[h]quinolinato) beryllium), TPBI (2,2',2"-(1,3,5-benzinetriyl)tris(1-phenyl-1-H-benzimidazole)), E3 (terfluorene), CBP (4,4'-N,N'-dicarbazole biphenyl), and combinations thereof.

More specifically, a material for forming each of the first and second electron transport layers 131 and 132 may include Alq$_3$(LUMO energy level: −3.1 eV)/Balq(LUMO energy level: −2.9 eV), CBP(LUMO energy level: −3.2 eV)/Balq, and the like.

Subsequently, a second electrode 140 is formed on the second electron transport layer 132. The second electrode 140 may be a cathode, and may be transparent or reflective. When the second electrode 140 is transparent, it may be formed thin enough to transmit light utilizing at least one conductive metal with a low work function selected from the group consisting of Mg, Ca, Al, Ag and alloys thereof. When the second electrode 140 is reflective, it may be formed thick enough to block light.

In addition, referring now to FIG. 1B, in an organic light emitting diode according to another embodiment of the present invention, a hole injection layer 150 or a hole transport layer 160 for effectively activating the injection and transport of holes from the first electrode 110 to the emission layer 120 may be further formed between the first electrode 110 and the emission layer 120, as shown in FIG. 1B.

The hole injection layer 150 may be formed by an arylamine-based compound, a starburst-type amine, or the like. More specifically, the hole injection layer 150 may be formed by 4,4,4-tris(3-methylphenylamino)triphenylamino (m-MTDATA), 1,3,5-tris[4-(3-methylphenylamino)phenyl]benzene (m-MTDATB), phthalocyanine copper (CuPc), or the like.

The hole transport layer 160 may be formed by an arylene diamine derivative, a starburst-type compound, a biphenyidiamine derivative, a ladder-type compound or the like. More specifically, the hole transport layer 160 may be formed by N,N'-diphenyl-N,N'-bis(3-methylphenyl)-(1,1'-biphenyl)-4,4'-diamine (TPD), N,N'-di(naphthalene-1-yl)-N,N'-diphenyl-benzidine (α-NPD), N,N'-diphenyl-N,N'-bis(1-naphthyl)-(1,1'-diphenyl)diamine (NPB), or the like.

In the organic light emitting diode in accordance with an embodiment of the present invention, an electron blocking layer 170 may be formed on the hole transport layer 160, as shown in FIG. 1B. The electron blocking layer 170 functions to suppress excitons produced from the emission layer 120 from being diffused during a driving process of the organic light emitting diode. The electron blocking layer 170 may be formed of Balq, BCP, CF-X, TAZ and/or spiro-TAZ.

In the organic light emitting diode in accordance with an embodiment of the present invention, a hole blocking layer 180 may be formed on the emission layer 120, as shown in FIG. 1B. The hole blocking layer 180 functions to prevent (or block) holes from moving to the first electron transport layer 131 when hole mobility is greater than electron mobility in the emission layer 120. The hole blocking layer 180 may be formed by 2-(4-biphenyl)-5-(4-tert-butylphenyl)-1,3,4-oxadiazole (PBD), spiro-PBD, and/or 3-(4'-t-butylphenyl)-4-phenyl-5-(4"-biphenyl)-1,2,4-triazole (TAZ).

Also, it has been described that the first electrode is an anode and the second electrode is a cathode in the above exemplary embodiment of the present invention. Alternatively, in another embodiment, the first electrode may be a cathode, and the second electrode may be an anode. In that case, the organic light emitting diode may have a structure in which the first electrode, the second electron transport layer, the first electron transport layer, the emission layer and the second electrode are sequentially formed.

The following exemplary embodiment illustrates the present invention in more detail. However, it is understood that the present invention is not limited by this exemplary embodiment.

Exemplary Embodiment

An indium tin oxide (ITO) layer was formed to a thickness of 130 nm as a first electrode. Subsequently, IDE-406 (manufactured by IDEMITSU KOSAN, LTD.) was formed to a thickness of 210 nm as a hole injection layer on the first electrode, and NPB was formed to a thickness of 20 nm as a hole transport layer. A red emission layer was formed to a thickness of 40 nm on the hole transport layer by mixing CBP as a host with Ir(piq)3 having a concentration of 15 wt % as a dopant. Alq$_3$ was formed to a thickness of 30 nm as a first electron transport layer. The LUMO energy level of Alq$_3$ is negative 3.1 ev (−3.1 eV). Subsequently, Balq was formed to a thickness of 10 nm as a second electron transport layer on the first electron transport layer. The LUMO energy level of Balq is negative 2.9 ev (−2.9 eV). Subsequently, an MgAg layer was formed to a thickness of 160 Å as a second electrode on the second electron transport layer, and an Al layer was formed to a thickness of 1000 Å on the MgAg layer.

Comparative Example

An indium tin oxide (ITO) layer was formed to a thickness of 130 nm as a first electrode. Subsequently, IDE-406 (manufactured by IDEMITSU KOSAN, LTD.) was formed to a thickness of 210 nm as a hole injection layer on the first electrode, and NPB was formed to a thickness of 20 nm as a hole transport layer. A red emission layer was formed to a thickness of 40 nm on the hole transport layer by mixing CBP as a host with Ir(piq)3 having a concentration of 15 wt % as a dopant. Alq$_3$ was formed to a thickness of 30 nm as a first electron transport layer. Subsequently, an MgAg layer was formed to a thickness of 160 Å as a second electrode on the first electron transport layer without a second electron transport layer, and an Al layer was formed to a thickness of 1000 Å on the MgAg layer.

Figure 2:
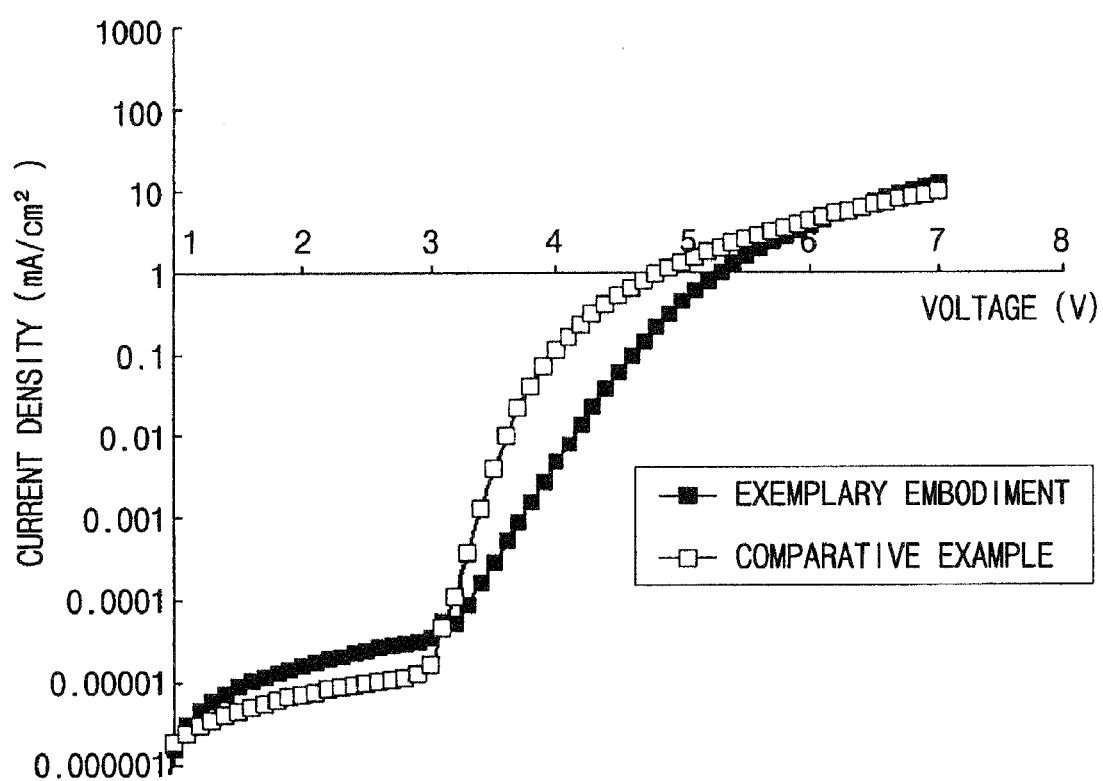
FIG. 2 is a graph of current density versus voltage measured in organic light emitting diodes fabricated in accordance with an exemplary embodiment of the present invention and a comparative example.

FIG. 2 is a graph of current density versus voltage measured in organic light emitting diodes fabricated in accordance with the above exemplary embodiment of the present invention and the comparative example. Voltage (V) is plotted along the x-axis, and current density (mA/cm$^2$) is plotted along the y-axis.

Referring to FIG. 2, it can be seen that when the same low voltage in the range of 3V to 4V is applied, the current density in the organic light emitting diode of the exemplary embodiment is about 1/10 lower than in the organic light emitting diode of the comparative example. It can be seen that the organic light emitting diode of the exemplary embodiment has a current density of below 0.01 mA/cm$^2$ under a low voltage below 4V, and therefore, it is possible to effectively prevent (or block) an element from emitting light when representing the color black. Also, it can be seen that there is no difference in current density between the exemplary embodiment of the invention and the comparative example at voltages above 5V.

Therefore, in the organic light emitting diode according to an embodiment of the present invention, a second electron transport layer having an absolute value of a LUMO energy level that is at least 0.2 eV smaller than that of a first electron transport layer is formed between a second electrode and the first electron transport layer, so that the second electron transport layer suppresses the injection and transport of electrons under a low voltage to maintain a low current density. Accordingly, it is possible to prevent (or block) an element from emitting light when representing the color black. Under a high voltage, the organic light emitting diode according to an embodiment of the present invention can be driven such that there is no difference in current density from the conventional light emitting diode in which layers are disposed such that the absolute value of the LUMO energy level decreases in steps from a second layer to an emission layer.

Further, the electron mobility of the first electron transport layer is greater than that of the second electron transport layer, so that the transport of electrons can be effectively performed under a high voltage.

According to an embodiment of the present invention, a second electron transport layer having an absolute value of a LUMO energy level smaller to that of a first electron transport layer is formed between a second electrode and the first electron transport layer, so that the second electron transport layer suppresses the injection and transport of electrons under a low voltage for displaying black to maintain a low current density. Therefore, it is possible to prevent (or block) an element from emitting light when representing the color black. Accordingly, the contrast and quality of the organic light emitting diode can be improved.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting diode, comprising:
   a first electrode;
   an emission layer on the first electrode;
   a first electron transport layer on the emission layer;
   a second electron transport layer on the first electron transport layer, and having an absolute value of a lowest unoccupied molecular orbital (LUMO) energy level smaller than that of the first electron transport layer, the first electron transport layer having an electron mobility greater than that of the second electron transport layer; and
   a second electrode on the second electron transport layer.

2. The organic light emitting diode according to claim 1, wherein the absolute value of the LUMO energy level of the second electron transport layer is at least about 0.2 eV smaller than that of the first electron transport layer.

3. The organic light emitting diode according to claim 1, wherein the absolute value of the LUMO energy level of the second electron transport layer is from about 0.2 to about 1 eV smaller than that of the first electron transport layer.

4. The organic light emitting diode according to claim 1, wherein the electron mobility of the first electron transport layer is not less than about $1 \times 10^{-6}$ cm$^2$/V·s.

5. The organic light emitting diode according to claim 1, wherein the electron mobility of the second electron transport layer is from about $1 \times 10^{-8}$ cm$^2$/V·s to about $1 \times 10^{-6}$ cm$^2$/V·s.

6. The organic light emitting diode according to claim 1, wherein the second electron transport layer has a thickness ranging from about 1 to about 20 nm.

7. The organic light emitting diode according to claim 1, wherein each of the first and second electron transport layers comprises a material selected from the group consisting of an oxazole-based compound, an isoxazole-based compound, a triazole-based compound, an isothiazole-based compound, an oxadiazole-based compound, a thiadiazole-based compound, a perylene-based compound, AlQ$_3$ (tris(8-quinolinolato)-aluminum), Balq, SAlq, Almq$_3$, Gaq'$_2$OPiv, Gaq'$_2$OAc, 2(Gaq'$_2$), BPQ (bis(phenylquinoxaline)), TPQ (starburst tris (phenylquinoxaline)), 1,3,5-triazine, BCP (2,9-dimethyl-4,7-diphenyl-1,10-phenanthroline), BeBq$_2$ (bis(10-hydroxybenzo[h]quinolinato)beryllium), TPBI (2,2',2"-(1,3,5-benzinetriyl)tris(1-phenyl-1-H-benzimidazole)), E3 (terfluorene), CBP (4,4'-N,N'-dicarbazole biphenyl), and combinations thereof.

8. The organic light emitting diode according to claim 7, wherein the first electron transport layer comprises AlQ$_3$, and the second electron transport layer comprises Balq.

9. The organic light emitting diode according to claim 7, wherein the first electron transport layer comprises CBP, and the second electron transport layer comprises Balq.

10. The organic light emitting diode according to claim 1, wherein, when a low voltage of 4V or less for displaying black is applied to the organic light emitting diode, the organic light emitting diode has a current density of about 0.01 mA/cM$^2$ or less.

11. A method of fabricating an organic light emitting diode, the method comprising:
    forming a first electrode;
    forming an emission layer on the first electrode;
    forming a first electron transport layer on the emission layer;
    forming a second electron transport layer on the first electron transport layer, the second electron transport layer having an absolute value of a LUMO energy level smaller than that of the first electron transport layer, the first electron transport layer is formed to have an electron mobility greater than that of the second electron transport layer; and
    forming a second electrode on the second electron transport layer.

12. The method of claim 11, wherein the absolute value of the LUMO energy level of the second electron transport layer is formed to be at least about 0.2 eV smaller than that of the first electron transport layer.

13. The method of claim 11, wherein the absolute value of the LUMO energy level of the second electron transport layer is formed to be from about 0.2 to about 1 eV smaller than that of the first electron transport layer.

14. The method of claim 11, wherein the electron mobility of the first electron transport layer is formed to be not less than about $1 \times 10^{-6}$ cm$^2$/V·s.

15. The method of claim 11, wherein the electron mobility of the second electron transport layer is formed to be from about $1 \times 10^{-8}$ cm$^2$/V·s to about $1 \times 10^{-6}$ cm$^2$/V·s.

16. The method of claim 11, wherein the second electron transport layer is formed to have a thickness ranging from about 1 to about 20 nm.

17. The method of claim 11, wherein each of the first and second electron transport layers is formed to comprise a material selected from the group consisting of an oxazole-based compound, an isoxazole-based compound, a triazole-based compound, an isothiazole-based compound, an oxadiazole-based compound, a thiadiazole-based compound, a perylene-based compound, Alq$_3$ (tris(8-quinolinolato)-aluminum), Balq, SAlq, Almq$_3$, Gaq'$_2$OPiv, Gaq'$_2$OAc, 2(Gaq'$_2$), BPQ (bis(phenylquinoxaline)), TPQ (starburst tris (phenylquinoxaline)), 1,3,5-triazine, BCP (2,9-dimethyl-4,7-diphenyl-1,10-phenanthroline), BeBq$_2$ (bis(10-hydroxybenzo[h]quinolinato)beryllium), TPBI (2,2',2"-(1,3,5-benzinetriyl)tris(1-phenyl-1-H-benzimidazole)), E3 (terfluorene), CBP (4,4'-N,N'-dicarbazole biphenyl), and combinations thereof.

18. The method of claim 17, wherein the first electron transport layer is formed to comprise Alq$_3$ or CBP, and the second electron transport layer is formed to comprise Balq.

* * * * *

UNITED STATES PATENT AND TRADEMARK OFFICE
CERTIFICATE OF CORRECTION

PATENT NO. : 7,994,713 B2
APPLICATION NO. : 12/350868
DATED : August 9, 2011
INVENTOR(S) : Ji-Hwan Yoon et al.

It is certified that error appears in the above-identified patent and that said Letters Patent is hereby corrected as shown below:

Column 7, Claim 5, line 38.    Delete "$1\times10^{<8}cm^2/V\cdot s$"
                               Insert -- $1\times10^{-8}cm^2/V\cdot s$ --

Column 7, Claim 7, line 48.    Delete "$AlQ_3$"
                               Insert -- $Alq_3$ --

Column 7, Claim 8, line 58.    Delete "$AlQ_3$"
                               Insert -- $Alq_3$ --

Column 8, Claim 10, line 8.    Delete "$0.01 mA/cM^2$"
                               Insert -- $0.01 mA/cm^2$ --

Signed and Sealed this
Second Day of October, 2012

David J. Kappos
*Director of the United States Patent and Trademark Office*